United States Patent
Arora et al.

(10) Patent No.: US 10,007,489 B1
(45) Date of Patent: Jun. 26, 2018

(54) AUTOMATED METHOD IDENTIFYING PHYSICAL MEMORIES WITHIN A CORE OR MACRO INTEGRATED CIRCUIT DESIGN

(71) Applicant: Cadence Design Systems, Inc., San Jose, CA (US)

(72) Inventors: Puneet Arora, Noida (IN); Steven Lee Gregor, Oswego, NY (US); Norman Robert Card, Vestal, NY (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 0 days. days.

(21) Appl. No.: 15/286,295

(22) Filed: Oct. 5, 2016

(51) Int. Cl.
| | |
|---|---|
| G06F 9/44 | (2018.01) |
| G06F 8/30 | (2018.01) |
| G06F 3/06 | (2006.01) |
| G06F 11/36 | (2006.01) |

(52) U.S. Cl.
CPC ............. G06F 8/30 (2013.01); G06F 3/067 (2013.01); G06F 3/0619 (2013.01); G06F 3/0659 (2013.01); G06F 11/3672 (2013.01)

(58) Field of Classification Search
None
See application file for complete search history.

(56) References Cited

U.S. PATENT DOCUMENTS

| | | | | |
|---|---|---|---|---|
| 7,185,309 B1* | 2/2007 | Kulkarni | ............. | G06F 17/5027 716/104 |
| 7,543,256 B1* | 6/2009 | Lukanc | .................... | G06F 8/48 716/106 |
| 7,574,680 B1* | 8/2009 | Kulkarni | ............. | G06F 17/5027 716/116 |
| 8,428,928 B1* | 4/2013 | McGaughy | ......... | G06F 17/5036 703/14 |
| 2003/0167426 A1* | 9/2003 | Slobodnik | .............. | G11C 29/16 714/718 |
| 2004/0062135 A1* | 4/2004 | Itakura | ................. | G11C 29/028 365/232 |
| 2004/0117744 A1* | 6/2004 | Nation | ................ | G06F 17/5045 716/104 |
| 2004/0128641 A1* | 7/2004 | Broberg, III | .......... | G06F 17/505 716/102 |
| 2013/0155785 A1* | 6/2013 | Romanovskyy | ..... | G11C 7/1045 365/189.05 |
| 2014/0270050 A1* | 9/2014 | Wang | .................. | G06F 17/5045 377/67 |

* cited by examiner

*Primary Examiner* — Daxin Wu
(74) *Attorney, Agent, or Firm* — Hunton Andrews Kurth LLP

(57) ABSTRACT

A system and method automatically determines the physical memories inside a core or macro and their association with logical memories and their enabling signals. An integrated circuit (IC) source file that describes an integrated circuit in a hardware description language is received. The IC source file includes macros corresponding to memory. For each macro, a physical description file corresponding to the macro is generated. The description includes how the macro corresponds to the physical memory, associations of physical memories with the logical memory, enabling conditions, and data needed to test the memory.

15 Claims, 8 Drawing Sheets

AUTOMATED METHOD IDENTIFYING PHYSICAL MEMORIES WITHIN A CORE OR MACRO INTEGRATED CIRCUIT DESIGN

BACKGROUND

An integrated circuit may be developed by a team of designers using computer aided design software in conjunction with library cells provided by the semiconductor foundry. FIGS. 1-4 show memory cells from the user's perspective. These can also be referred to as logical memories. A generic core (e.g., macro) can include one or more memory built-in-self-test (MBIST) interfaces to test these logical memories. FIG. 1 shows the typical logical memory cell inside a generic core. As shown in FIGS. 2-4, the same logical memory inside a core may be configured as multiple physical memories or slices of physical memories. Each designer modifies these macros based on the specification for his part of the integrated circuit. A macro has a corresponding input file, e.g. core/macro specification file, which contains information describing the core/macro design, control signals, interface signals and logical array/memory definitions. Overall, manufacturing costs are reduced by testing and validating a design prior to fabrication to determine all physical memories in the core, their association with the logical memories and that their associated enabling signals physical memories are functioning properly.

FIG. 1 shows a logical memory that consists of 94 words, where each word is 100-bits wide. FIGS. 2-4 are possible implementations of the same logical memory. FIG. 2 and FIG. 3 implement the logical memory using 3 physical memories of different sizes while FIG. 4 implements the same logical memory using 6 physical memories. Each macro interface can consist of multiple logical memories. The physical configuration affects performance e.g. timing delays.

Further, each macro may have multiple interfaces. The name of a macro interface does not include a description of the underlying physical memories and their enabling signals because the same core can be configured in different fashions by each design team member who accesses the core. Without an accurate description, testing of the memories cannot be done properly or accurately which leads to field returns.

At this time, each of the integrated circuit designers manually creates the needed descriptions and provides this in a file to any tool so that these memories can be tested. This is time-consuming, error prone and may lead to issues as mentioned above that in some cases not all of the physical memories are getting tested.

DETAILED DESCRIPTION

Embodiments of the present invention use the macro design containing memories and automatically determine all the physical memories and their association with the logical arrays (memories) so as to test all the physical memories from the associated test interface on the macro. A file is generated that contains the view of the macro. The view is a description that includes each physical memory or slice of a memory, their association with the logical memories, their enabling conditions and other information necessary to test each physical memory or slice of physical memory. This file is used by the subsequent commands, for example, in a Cadence synthesis tool to actually insert the memory built in self test (MBIST) logic.

MBIST interfaces, provided by the manufacturer, enable a customer to functionally test the embedded RAM structures in a design. The interface access points are multiple pipeline stages away from the target RAM and support access of multiple logical arrays from a common interface. The standard text file, e.g. MBIST information file specification (MBIF), defines each core MBIST interface that includes statically controlled signals enabling MBIST operations, MBIST logic install point and interface module name, MBIST interface signals and associated functions, along with embedded logical memory access features. The MBIF does not include binding of logical memories to physical memories, defining physical memory features, or defining MBIST requirements. The user of the core manually provides this information (mostly inside a file), as shown at 20 in FIG. 5, like binding of logical memory to physical memories, enabling signals for each physical memory so that all the physical memories can be tested. A user also manually modifies the associated files to reflect the selected physical layout of the embedded RAM structure, as shown at 20 in FIG. 5.

Figure 1:
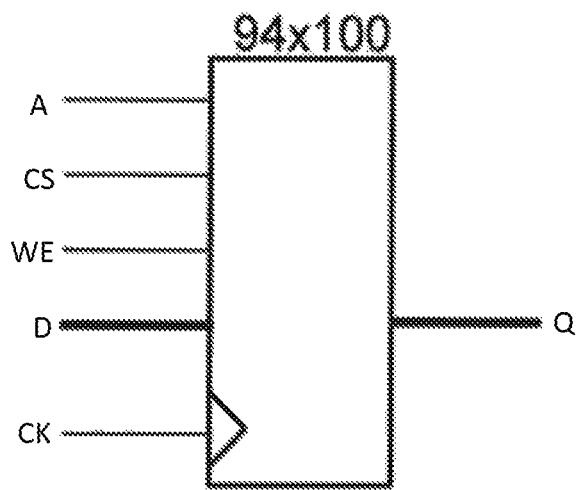
FIG. 1 shows a logical memory that consists of 94 words, where each word is 100-bits wide.
Figure 2:
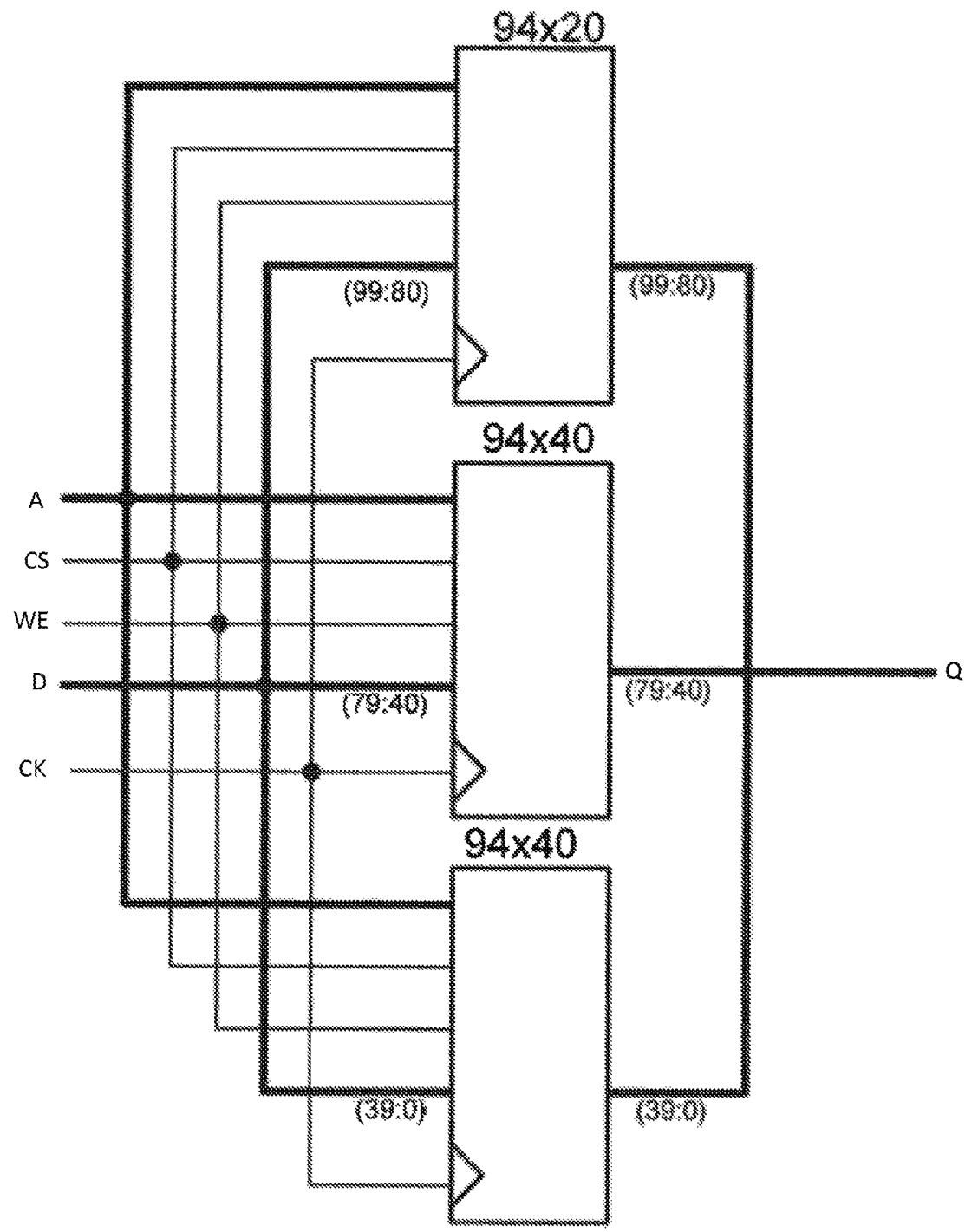
FIG. 2 implements the logical memory shown in FIG. 1 as one configuration of 3 physical memories of different sizes.
Figure 3:
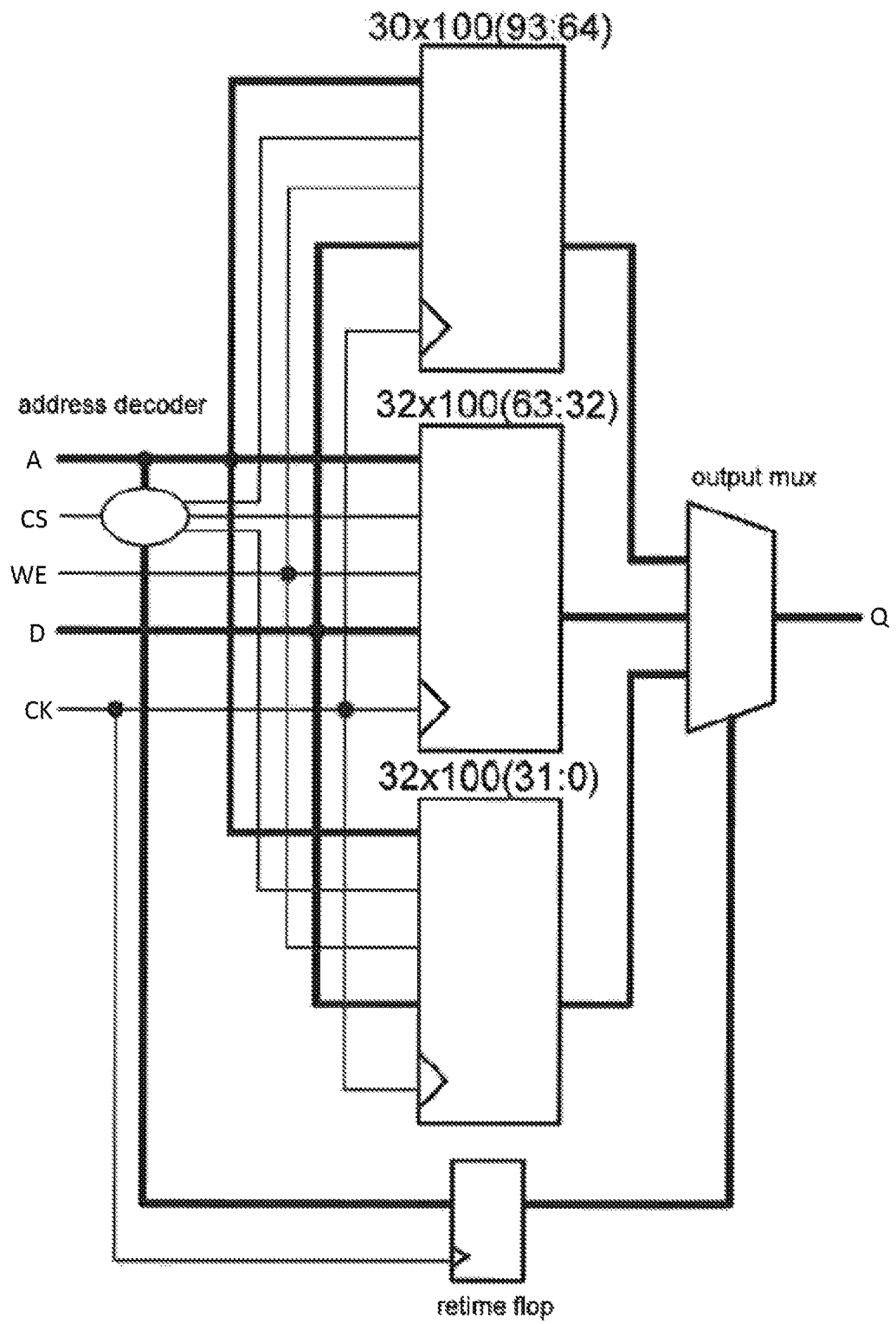
FIG. 3 implements the logical memory shown in FIG. 1 as another configuration of 3 physical memories of different sizes.
Figure 4:
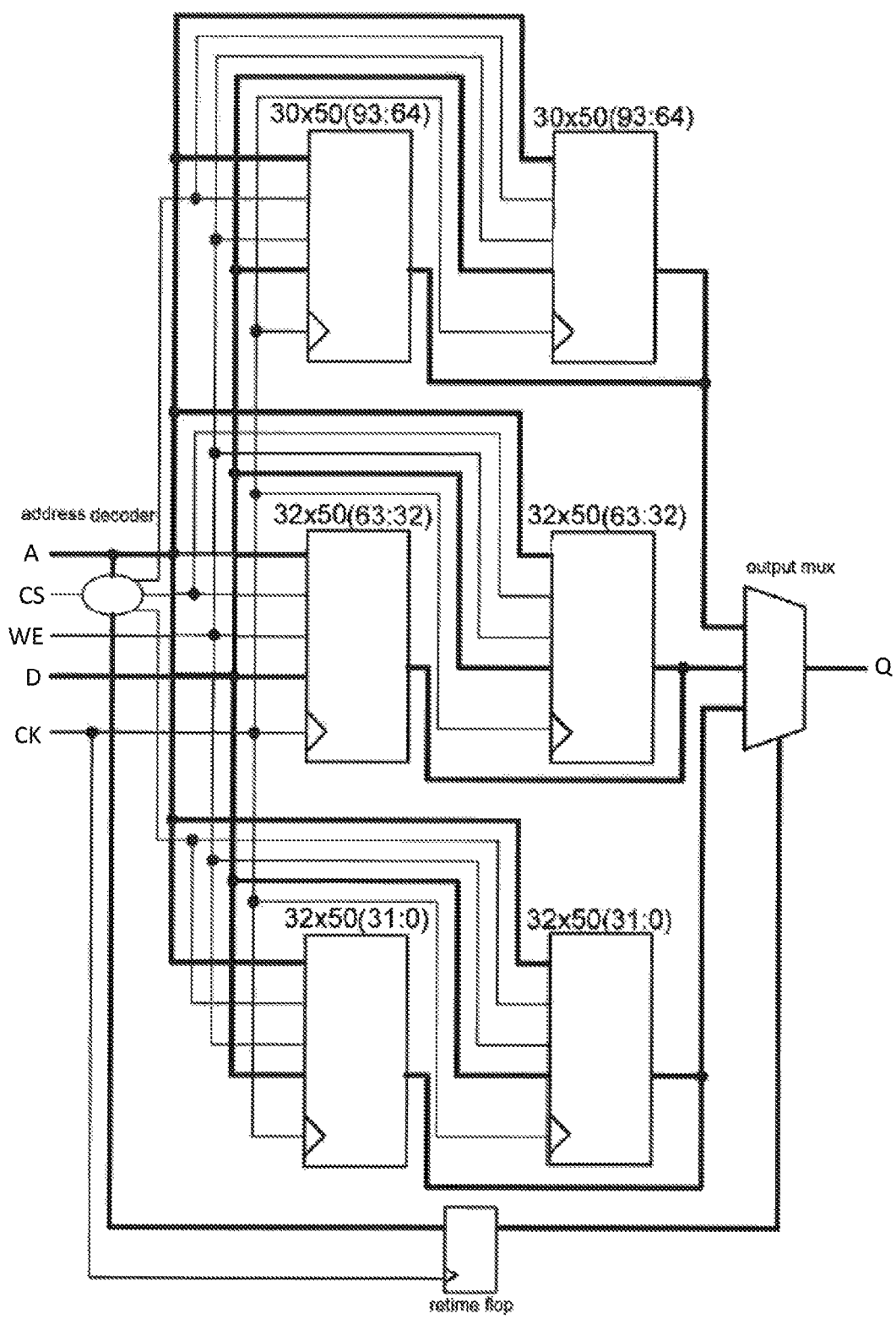
FIG. 4 implements the logical memory shown in FIG. 1 as 6 physical memories.

A very simple example to understand the complexity of this method is that a logical memory can consist of multiple physical memories. This logical memory may be sliced in a fashion that it is divided into 3 parts based on address space (shown in FIG. 3). Each part represents a portion of the address space of the logical memory which basically means that one needs to test one logical memory as 3 separate physical memories (also known as horizontal partition). The other possible case is that the logical memory may be sliced in a fashion that it is divided into 3 parts based on data bus size (shown in FIG. 2). Here, the data size of the logical memory is 100-bits wide but only 40-bits can be read at one time. During memory testing, the data comes out of the core in 3 reads: 40-bits in the first read, another 40 bits in another read, and the remaining 20-bits in the third read (also known as vertical partition). Alternatively, the logical memory can have 'n' physical memories where some logical memories are horizontally partitioned and some are vertically partitioned and some are not partitioned. In this situation, the core can have 'm' number of logical memories. Each physical design has different performance results due to the partitioning.

There are many ways to represent the physical memory module instantiation. The memory views include a Liberty file representation, memory wrapper, logical wrapper, and multi-view memory.

The Liberty file or .lib file is an ASCII representation of the timing and power parameters associated with any cell in given semiconductor technology. The timing and power parameters are obtained by simulating the memory under a variety of conditions. The data includes timing models and data to calculate I/O delay paths, timing check values, and interconnect delays. Path delays in a memory cell depend upon the electrical behavior of interconnects between the modules within the memory cell. The parasitic information can be based on the layout of the design, but can be estimated when no layout information is available.

A memory wrapper is a Liberty file representation of the memory module and requiring the definition of all memory ports.

A logical wrapper is a design module encapsulating the memory module or memory wrapper and additional discrete logic. The module permits the implementation of functions such as error correcting code (ECC) and repair outside the memory module itself. There is a 1:1 relationship between the memory module and logical wrapper boundary.

A multi-view memory is a logical wrapper that supports two distinct views of the encapsulated memory. The first view is the boundary of the memory module. The second view is the boundary of the logical wrapper containing ECC.

Macro models describe the shared memory interface to one or more physical memories. They can support multiple port interfaces, different memory port classes, and all the features available to memory modules, memory wrappers, and logical wrappers. In an embodiment, there is 1 logical memory per macro. There can be more than one associated physical memory. The physical memories need not have the same physical dimensions. In another embodiment there are n logical memories per macro. A decoded interface allows access to one or more logical memories where each logical memory can include one or more physical memories.

All of the aforementioned memory views are automatically accessed by an embodiment of the invention and used to automatically generate a macro view of the integrated circuit that includes the memory specific information.

Figure 5:
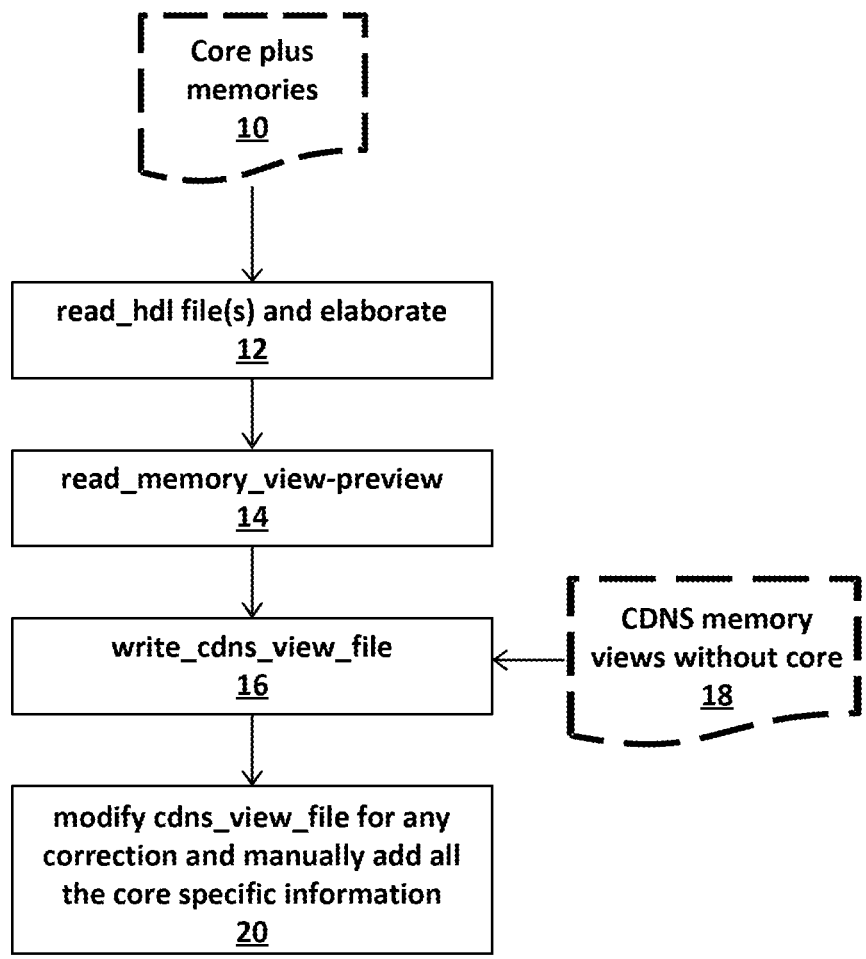
FIG. 5 illustrates a flowchart of the prior art.

FIG. 5 illustrates a process according to the prior art. An integrated circuit (IC) is described in a HDL file 10 that contains the core plus memories. In step 12, the HDL file 10 is read and a generic netlist is created. In step 14, a tool command is run and template memory view files 16 are generated. These view files contain all the possible information that the tool could automatically infer from the Liberty files. The missing information is mentioned as comments in this file. These memory views do not include a physical description of the core. In step 20, the generated view file is modified for any corrections which are mentioned as comments in the file. The designer manually adds the core specific information.

Figure 6:
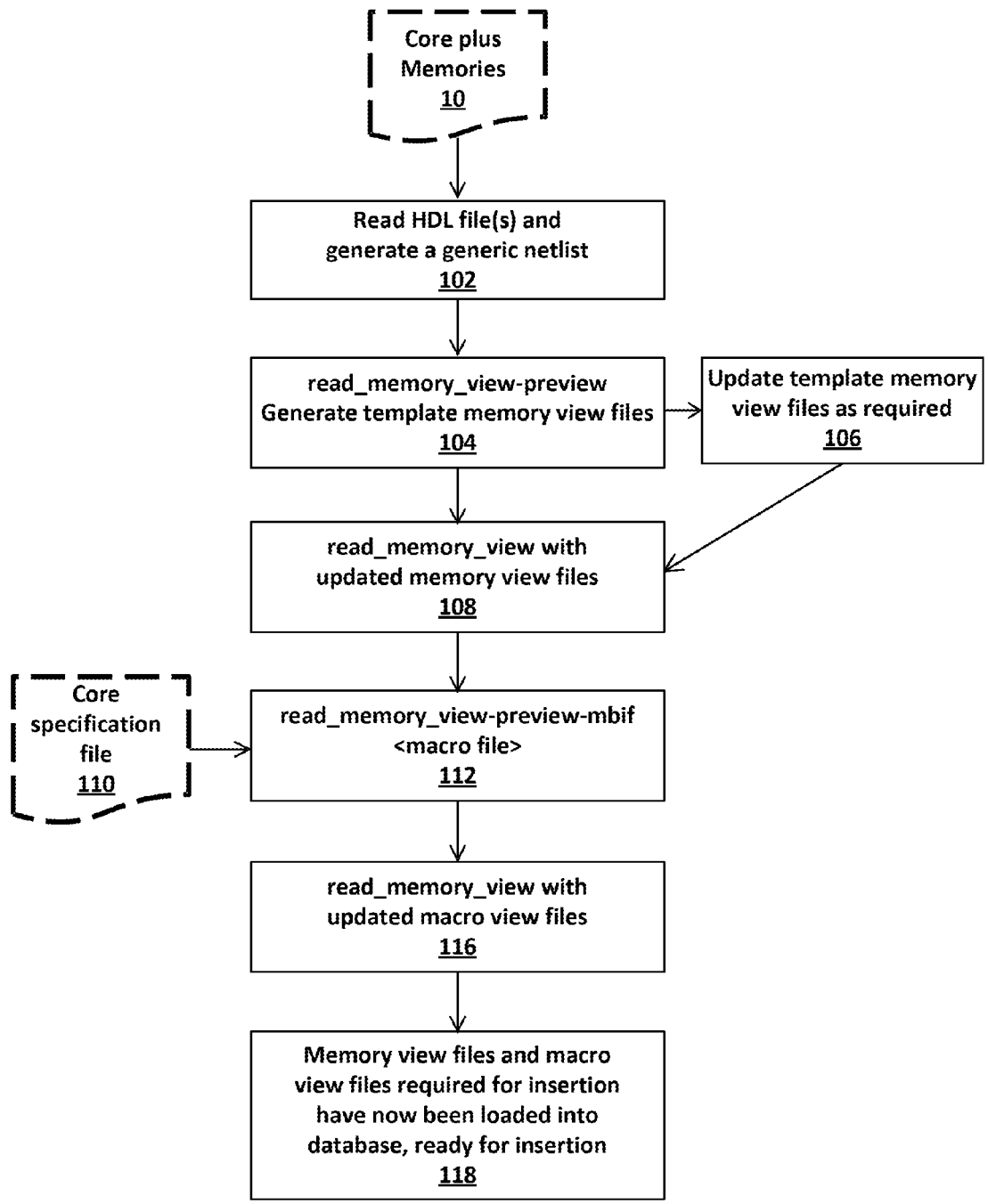
FIG. 6 illustrates a flowchart 100 according to an embodiment of the invention.
Figure 8:
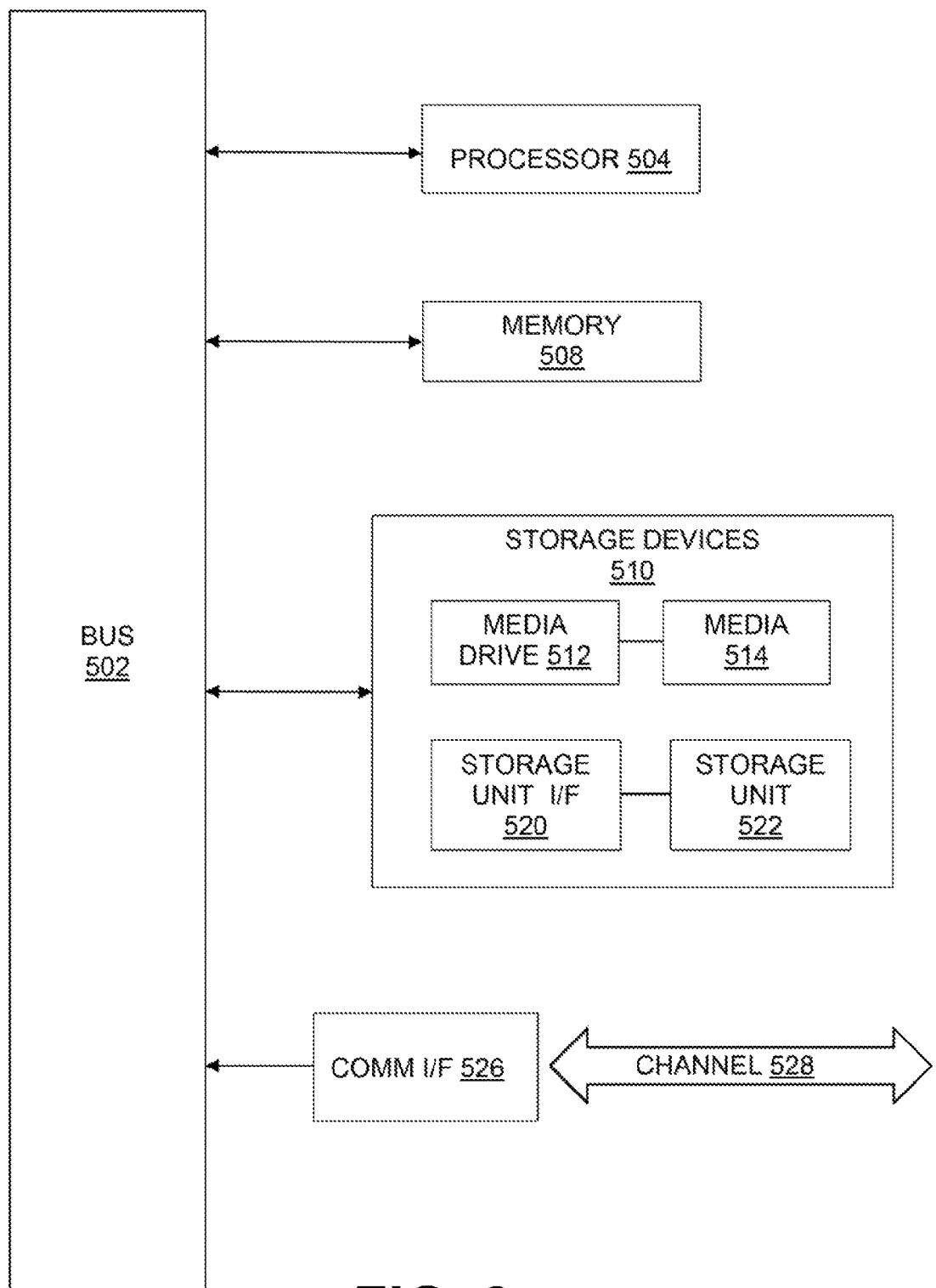
FIG. 8 is a diagram illustrating an example computing module that may be used in implementing various features of embodiments of the disclosed systems and methods.

FIG. 6 illustrates a flowchart 100 according to an embodiment of the invention. The method of flowchart 100 may be implemented in a computing module such as shown in FIG. 8 (described below). An integrated circuit (IC) is described in a HDL file 10 that contains the core specification file plus memories.

In step 102, the HDL file 10 is read and a generic netlist is created.

In step 104, a tool command is run and template memory view files are generated. These view files contain all the possible information that the tool could automatically infer from the Liberty files. The missing information is mentioned as comments in this file.

In step 106, the template memory view files are updated as required.

The updated template memory view files are then read back into the synthesis tool database in step 108.

In step 112, macro view files 134 are generated from the MBIST information file specifications and using input core specification file 110.

The updated macro view files 134 are then read back into the synthesis tool database in step 116.

The updated template memory view files and updated macro view files have been loaded into the synthesis tool database. In step 118, these files are used by the next set of commands to insert memory testing hardware.

Figure 7:
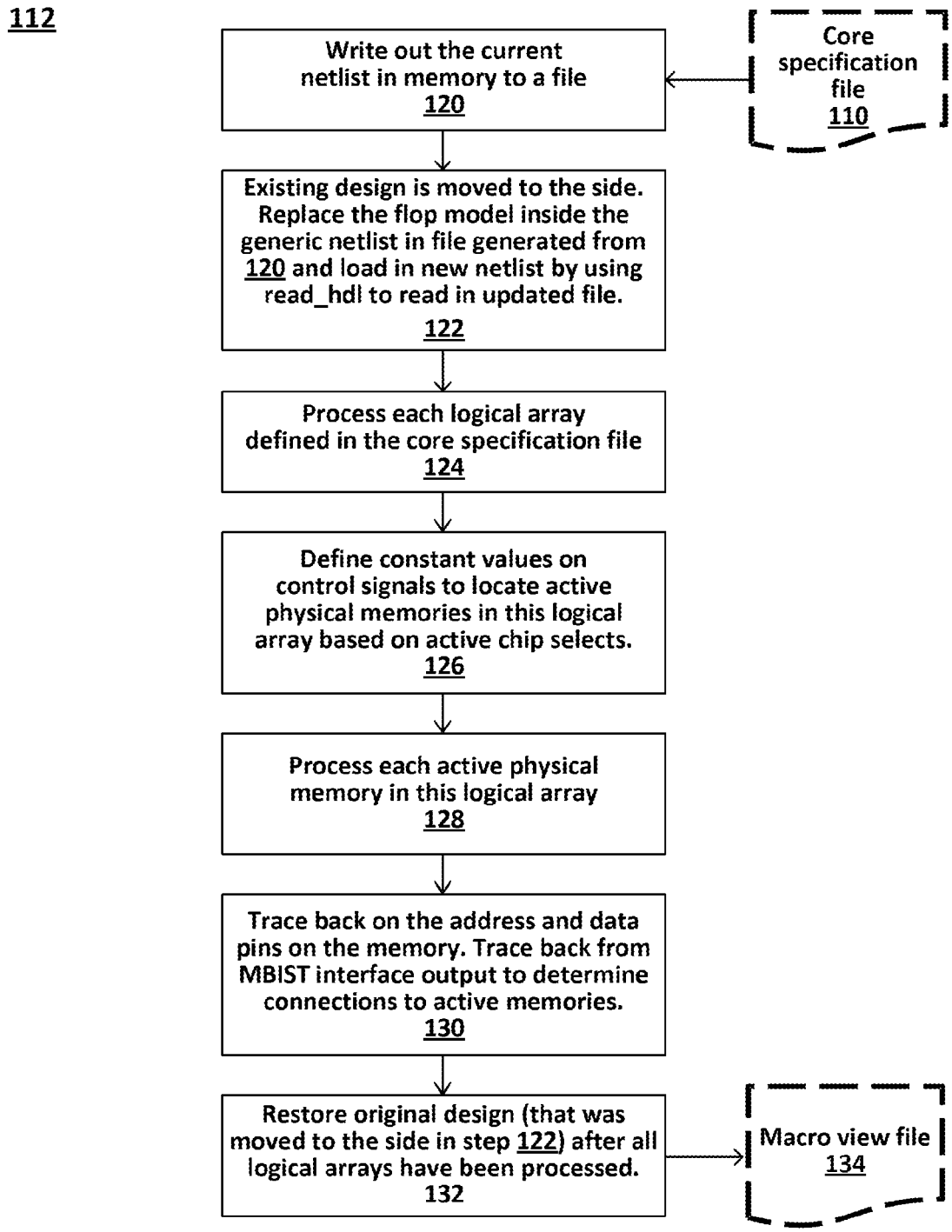
FIG. 7 illustrates a flowchart that provides greater detail of step 112 of FIG. 6.

FIG. 7 illustrates a flowchart that provides greater detail of step 112. In step 112, the synthesis tool (e.g., Cadence synthesis tool) database is populated with final physical memory descriptions from step 108.

In step 120, the current netlist in the synthesis tool database is written out to a file.

In step 122, the existing design is moved aside (for restoration later at step 132), and the flop model in the generic netlist file written out by step 120 is replaced with a buffer model. This is done to allow the tool to utilize an existing trace back function, dft_trace_back, which traverses the netlist logic to determine the driver, but normally stops at flops or primary inputs. If the flop is replaced with a buffer, the tool is capable of tracing through the buffers, eventually locating connections to and from physical memories. In step 122, this updated netlist is read back in to synthesis tool and replaces the original design. Each logical array, as defined in the core specification file 110 is then processed.

In step 124, each logical array, as defined in the core specification file 110 is then processed. In step 126, all the signals impacting the controlling of any logical memory are retrieved from the input (core specification) file 110.

In step 126, a specific DFT configuration mode is created by specifying different possible active values on these signals and these constant values are propagated through-out the macro design. The chip-select (or memory enable) pin of the different physical memories is traced after propagating these values.

In step 128, those physical memories whose chip-select pin is active in a particular mode of operation are selected with those particular set of signal values.

Once the active physical memories have been identified corresponding to a set of constant values for controlling signals, in step 130, the MBIST interface output ports (of the core design) can be traced back (tracing through flops that have been replaced by buffers) to determine the connections to the output buses of the active physical memories. Also in step 130, the inputs of the physical memories are traced back to determine connections to the MBIST interface input ports (of the core design). This is how the bindings of each logical memory are determined and then every set of possible signal values along with the associated physical memories are written into the generated macro view file. The macro view file 134 contains the binding information.

In step 132, after the macro view file is generated, the original design is restored.

The design cycle time is reduced when the method according to an embodiment of the invention is employed as the designer can generate the macro view file (containing the binding of the MBIST interfaces to logical memories, and binding of logical memories to physical memories) automatically inside the synthesis tool instead of manually creating it. It also helps the designer to efficiently simulate the different physical implementations of the same logical memories by updating the design parameters in the HDL file 10 that contains the core specification file plus memories. The design parameters may include the number of logical memories per macro and the array shape per macro.

The term tool can be used to refer to any apparatus configured to perform a recited function. For example, tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented.

As used herein, the term module might describe a given unit of functionality that can be performed in accordance with one or more embodiments of the present invention. As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

Where components or modules of processes used in conjunction with the operations described herein are implemented in whole or in part using software, in one embodiment, these software elements can be implemented to operate with a computing or processing module capable of carrying out the functionality described with respect thereto. One such example-computing module is shown in FIG. 8. Various embodiments are described in terms of this example-computing module 500. After reading this description, it will become apparent to a person skilled in the relevant art how to implement the invention using other computing modules or architectures.

Referring now to FIG. 8, computing module 500 may represent, for example, computing or processing capabilities found within desktop, laptop and notebook computers; hand-held computing devices (PDA's, smart phones, cell phones, palmtops, etc.); mainframes, supercomputers, workstations or servers; or any other type of special-purpose or general-purpose computing devices as may be desirable or appropriate for a given application or environment. Computing module 500 might also represent computing capabilities embedded within or otherwise available to a given device. For example, a computing module 500 might be found in electronic devices such as, for example, digital cameras, navigation systems, cellular telephones, portable computing devices, modems, routers, wireless access points (WAPs), terminals and other electronic devices that might include some form of processing capability.

Computing module 500 might include, for example, one or more processors, controllers, control modules, or other processing devices, such as a processor 504. Processor 504 might be implemented using a general-purpose or special-purpose processing engine such as, for example, a microprocessor, controller, or other control logic. In the illustrated example, processor 504 is connected to a bus 502, although any communication medium can be used to facilitate interaction with other components of computing module 500 or to communicate externally.

Computing module 500 might also include one or more memory modules, simply referred to herein as main memory 508. For example, preferably random access memory (RAM) or other dynamic memory, might be used for storing information and instructions to be executed by processor 504. Main memory 508 might also be used for storing temporary variables or other intermediate information during execution of instructions to be executed by processor 504. Computing module 500 might likewise include a read only memory ("ROM") or other static storage device coupled to bus 502 for storing static information and instructions for processor 504.

The computing module 500 might also include one or more various forms of information storage mechanism 510, which might include, for example, a media drive 512 and a storage unit interface 520. The media drive 512 might include a drive or other mechanism to support fixed or removable storage media 514. For example, a hard disk drive, a floppy disk drive, a magnetic tape drive, an optical disk drive, a CD or DVD drive (R or RW), or other removable or fixed media drive might be provided. Accordingly, storage media 514 might include, for example, a hard disk, a floppy disk, magnetic tape, cartridge, optical disk, a CD or DVD, or other fixed or removable medium that is read by, written to or accessed by media drive 512. As these examples illustrate, the storage media 514 can include a computer usable storage medium having stored therein computer software or data.

In alternative embodiments, information storage mechanism 510 might include other similar instrumentalities for allowing computer programs or other instructions or data to be loaded into computing module 500. Such instrumentalities might include, for example, a fixed or removable storage unit 522 and an interface 520. Examples of such storage units 522 and interfaces 520 can include a program cartridge and cartridge interface, a removable memory (for example, a flash memory or other removable memory module) and memory slot, a PCMCIA slot and card, and other fixed or removable storage units 522 and interfaces 520 that allow software and data to be transferred from the storage unit 522 to computing module 500.

Computing module 500 might also include a communications interface 524. Communications interface 524 might be used to allow software and data to be transferred between computing module 500 and external devices. Examples of communications interface 524 might include a modem or softmodem, a network interface (such as an Ethernet, network interface card, WiMedia, IEEE 802.XX or other interface), a communications port (such as for example, a USB port, IR port, RS232 port Bluetooth® interface, or other port), or other communications interface. Software and data transferred via communications interface 524 might typically be carried on signals, which can be electronic, electromagnetic (which includes optical) or other signals capable of being exchanged by a given communications interface 524. These signals might be provided to communications interface 524 via a channel 528. This channel 528 might carry signals and might be implemented using a wired or wireless communication medium. Some examples of a channel might include a MoCA channel over coaxial cable, phone line, a cellular link, an RF link, an optical link, a network interface, a local or wide area network, and other wired or wireless communications channels.

In this document, the terms "computer program medium" and "computer usable medium" are used to generally refer to physical storage media such as, for example, memory 508, storage unit 520, and media 514. These and other various forms of computer program storage media or computer usable storage media may be involved in storing and providing one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing module 500 to perform features or functions of the disclosed systems and methods as discussed herein.

In the foregoing Description of Embodiments, various features may be grouped together in a single embodiment for purposes of streamlining the disclosure. This method of disclosure is not to be interpreted as reflecting an intention that the claims require more features than are expressly recited in each claim. Rather, as the following claims reflect, inventive aspects lie in less than all features of a single foregoing disclosed embodiment. Thus, the following claims are hereby incorporated into this Description of the Embodiments, with each claim standing on its own as a separate embodiment of the invention.

Moreover, it will be apparent to those skilled in the art from consideration of the specification and practice of the present disclosure that various modifications and variations can be made to the disclosed systems and methods without departing from the scope of the disclosure, as claimed. Thus, it is intended that the specification and examples be considered as exemplary only, with a true scope of the present disclosure being indicated by the following claims and their equivalents.

We claim:

1. A method comprising:
   receiving an integrated circuit source file that describes an integrated circuit in a hardware description language, wherein the integrated circuit source file includes macros corresponding to a physical memory; and
   for each of the macros, generating a physical description file having data corresponding to (i) the physical memory, (ii) an association with at least one logical memory of the physical memory, (iii) a plurality of enabling signals, and (iv) data needed to test the physical memory, wherein the generating the physical description file includes retrieving a physical description for each of the macros according to a design parameter that is selected from a group that includes a number of the at least one logical memory per macro and an array shape per macro.

2. The method of claim 1, wherein the generating the physical description file further includes:
   generating a generic netlist corresponding to the macro;
   generating a test configuration that is specific to the physical description, wherein active parts of the physical memory have been identified; and
   identifying interface input ports that are connected to the active parts of the physical memory.

3. The method of claim 2, further comprising:
   identifying connections from output ports of a test interface to output buses or pins of the physical memory.

4. A method comprising:
   receiving an integrated circuit source file that describes an integrated circuit in a hardware description language, wherein the integrated circuit source file includes macros corresponding to a physical memory;
   generating a netlist from the integrated source file, wherein the netlist includes a buffer submodel of the flops inside each macro; and
   for each of the macros, generating a physical description file having data corresponding to (i) the physical memory, (ii) an association with at least one logical memory of the physical memory, (iii) a plurality of enabling signals, and (iv) data needed to test the physical memory, wherein the generating the physical description file includes retrieving a physical description for each of the macros according to a design parameter that is selected from a group that includes a number of the at least one logical memory per macro and an array shape per macro.

5. The method of claim 4, wherein the generating the physical description file further includes:
   generating a generic netlist corresponding to the macro;
   generating a test configuration that is specific to the physical description, wherein active parts of the physical memory have been identified; and
   identifying interface input ports that are connected to the active parts of the physical memory.

6. The method of claim 5, further comprising:
   identifying connections from output ports of a test interface to output buses or pins of the physical memory.

7. An integrated circuit design tool, comprising:
   a memory unit storing an integrated circuit design;
   one or more processors coupled to the memory unit and configured to identify physical memories within the integrated circuit design by:
      receiving an integrated circuit source file that describes an integrated circuit in a hardware description language, wherein the integrated circuit source file includes macros corresponding to a particular physical memory of the physical memories; and
      for each of the macros, generating a physical description file having data corresponding to (i) the particular physical memory, (ii) an association with at least one logical memory of the particular physical memory, (iii) a plurality of enabling signals, and (iv) data needed to test the particular physical memory, wherein the generating the physical description file includes retrieving a physical description for each of the macros according to a design parameter that is selected from a group that includes a number of the at least one logical memory per macro and an array shape per macro.

8. The integrated circuit design tool of claim 7, wherein the generating the physical description file further includes:
   generating a generic netlist corresponding to the macro;
   generating a test configuration that is specific to the physical description, wherein active parts of the particular physical memory have been identified; and identifying interface input ports that are connected to the active parts of the particular physical memory.

9. The integrated circuit design tool of claim 8, wherein the one or more processors are further configured to identify connections from output ports of a test interface to output buses or pins of the physical memory.

10. An integrated circuit design tool, comprising:
a memory unit storing an integrated circuit design;
one or more processors coupled to the memory unit and configured to identify physical memories within the integrated circuit design by:
receiving an integrated circuit source file that describes an integrated circuit in a hardware description language, wherein the integrated circuit source file includes macros corresponding to a particular physical memory of the physical memories;
generating a netlist from the integrated source file, wherein the netlist includes a buffer submodel of the flops inside each macro; and
for each of the macros, generating a physical description file having data corresponding to (i) the particular physical memory, (ii) an association with at least one logical memory of the particular physical memory, (iii) a plurality of enabling signals, and (iv) data needed to test the particular physical memory, wherein the generating the physical description file includes retrieving a physical description for each of the macros according to a design parameter that is selected from a group that includes a number of the at least one logical memory per macro and an array shape per macro.

11. The integrated circuit design tool of claim 10, wherein the generating the physical description file further includes:
generating a generic netlist corresponding to the macro;
generating a test configuration that is specific to the physical description, wherein active parts of the particular physical memory have been identified; and
identifying interface input ports that are connected to the active parts of the particular physical memory.

12. The integrated circuit design tool of claim 11, wherein the one or more processors are further configured to identify connections from output ports of a test interface to output buses or pins of the physical memory.

13. A non-transitory computer-usable storage medium comprising executable computer code stored in the computer-usable storage medium, wherein the executable computer code when executed by a computer system that comprises at least one processor, causes the computer system to execute a method for identifying physical memories within an integrated circuit design, the method comprising:
receiving an integrated circuit source file that describes an integrated circuit in a hardware description language, wherein the integrated circuit source file includes macros corresponding to a physical memory; and
for each of the macros, generating a physical description file having data corresponding to (i) the physical memory, (ii) an association with at least one logical memory of the physical memory, (iii) a plurality of enabling signals, and (iv) data needed to test the physical memory, wherein the generating the physical description file includes retrieving a physical description for each of the macros according to a design parameter that is selected from a group that includes a number of the at least one logical memory per macro and an array shape per macro.

14. The computer-usable storage medium of claim 13, wherein the generating the physical description file includes:
generating a generic netlist corresponding to the macro;
generating a test configuration that is specific to the physical description, wherein active parts of the physical memory have been identified; and
identifying interface input ports that are connected to the active parts of the physical memory.

15. The computer-usable storage medium of claim 14, wherein the method further comprises:
identifying connections from output ports of a test interface to output buses or pins of the physical memory.

* * * * *